US008223981B2

(12) United States Patent
Haila et al.

(10) Patent No.: US 8,223,981 B2

(45) Date of Patent: Jul. 17, 2012

(54) WIDE DYNAMIC RANGE MICROPHONE

(75) Inventors: Olli Haila, Piikkio (FI); Kieran Harney, Andover, MA (US); Gary W. Elko, Summit, NJ (US)

(73) Assignee: Analog Devices, Inc., Norwood, MA (US)

(*) Notice: Subject to any disclaimer, the term of this patent is extended or adjusted under 35 U.S.C. 154(b) by 357 days.

(21) Appl. No.: 12/470,986

(22) Filed: May 22, 2009

(65) Prior Publication Data

US 2009/0316916 A1 Dec. 24, 2009

Related U.S. Application Data

(60) Provisional application No. 61/055,611, filed on May 23, 2008.

(51) Int. Cl.
*H03G 3/20* (2006.01)

(52) U.S. Cl. ........................................... 381/57; 381/92

(58) Field of Classification Search ........................ None
See application file for complete search history.

(56) References Cited

U.S. PATENT DOCUMENTS

| | | | | |
|---|---|---|---|---|
| 5,363,452 | A | 11/1994 | Anderson | 381/173 |
| 5,479,813 | A | 1/1996 | Pla et al. | 73/4 R |
| 6,101,258 | A * | 8/2000 | Killion et al. | 381/321 |
| 6,226,386 | B1 | 5/2001 | Akina | 381/173 |
| 7,561,700 | B1 * | 7/2009 | Bernardi et al. | 381/92 |
| 2002/0057815 | A1 | 5/2002 | Killion | 381/313 |
| 2005/0018864 | A1 * | 1/2005 | Minervini | 381/175 |
| 2005/0063553 | A1 | 3/2005 | Ozawa | 381/92 |
| 2008/0002841 | A1 * | 1/2008 | Baker et al. | 381/113 |
| 2008/0205668 | A1 | 8/2008 | Torii et al. | 381/113 |
| 2009/0323973 | A1 * | 12/2009 | Dyba | 381/58 |

FOREIGN PATENT DOCUMENTS

EP 0 545 731 A1 6/1993

(Continued)

OTHER PUBLICATIONS

Communication of Extended European Search Report; Application No. EP 08 00 2950, Aug. 21, 2008.

(Continued)

*Primary Examiner* — Benjamin Sandvik

(74) *Attorney, Agent, or Firm* — Sunstein Kann Murphy & Timbers LLP

(57) ABSTRACT

A microphone system has an output and at least a first transducer with a first dynamic range, a second transducer with a second dynamic range different than the first dynamic range, and coupling system to selectively couple the output of one of the first transducer or the second transducer to the system output, depending on the magnitude of the input sound signal, to produce a system with a dynamic range greater than the dynamic range of either individual transducer. A method of operating a microphone system includes detecting whether a transducer output crosses a threshold, and if so then selectively coupling another transducer's output to the system output. The threshold may change as a function of which transducer is coupled to the system output. The system and methods may also combine the outputs of more than one transducer in a weighted sum during transition from one transducer output to another, as a function of time or as a function of the amplitude of the incident audio signal. Methods of operating the system may include equalizing the outputs of two or more transducers prior to coupling one or more outputs to the system output.

20 Claims, 14 Drawing Sheets

FOREIGN PATENT DOCUMENTS

| | | | |
|---|---|---|---|
| EP | 0 932 142 | A2 | 7/1999 |
| EP | 0 932 142 | A3 | 3/2000 |
| EP | 1 571 880 | A2 | 9/2005 |
| EP | 1 962 546 | A2 | 8/2008 |
| EP | 1 962 546 | A3 | 9/2008 |
| EP | 1 571 880 | A3 | 7/2009 |
| JP | 03 139097 | | 6/1991 |
| JP | 2001-169395 | | 6/2001 |
| JP | 59 040798 | | 3/2004 |
| JP | 2006-332736 | | 12/2006 |
| JP | 2007-28267 | | 2/2007 |
| WO | WO 2006/023016 | A1 | 3/2006 |
| WO | WO 2007/007414 | A1 | 1/2007 |
| WO | WO 2008/014324 | A2 | 1/2008 |
| WO | WO 2008/014324 | A3 | 1/2008 |

OTHER PUBLICATIONS

Authorized Officer Robert Will, *Notification of Transmittal of the International Search Report and the Written Opinion of the International Searching Authority*, PCT/US2009/044997, Apr. 8, 2010, 16 pages.

Authorized Officer Viorel Moscu, *International Search Report and the Written Opinion of the International Searching Authority*, PCT/US2007/074328, Mar. 27, 2008.

Simon Beck, Withers and Rogers LLP to European Patent Office re: European Patent Application No. 09751662.9 based on PCT/US2009/044997 "Wide Dynamic Range Microphone," 19 pages.

M. Bello, Official Communication; Application No. 09751662.9-1224, 2 pages, Jan. 3, 2011.

* cited by examiner

Figure 4A
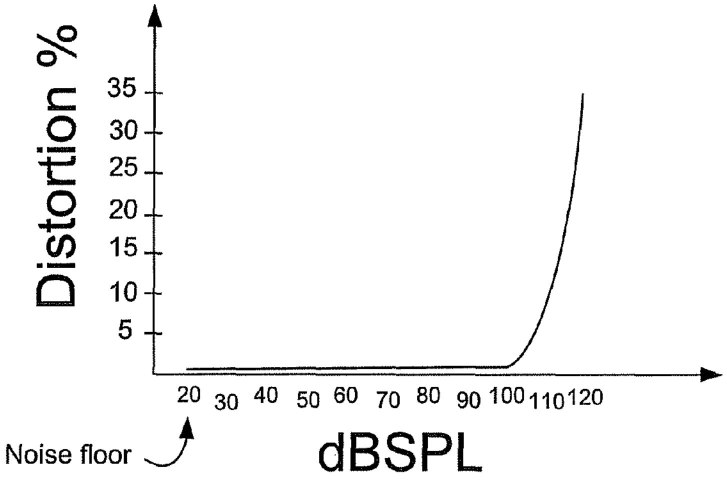
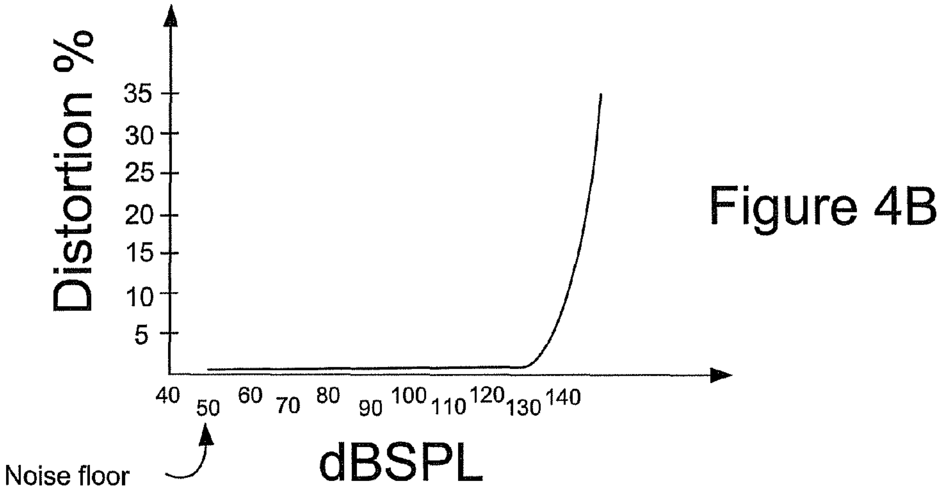
Figure 4B
Figure 4C
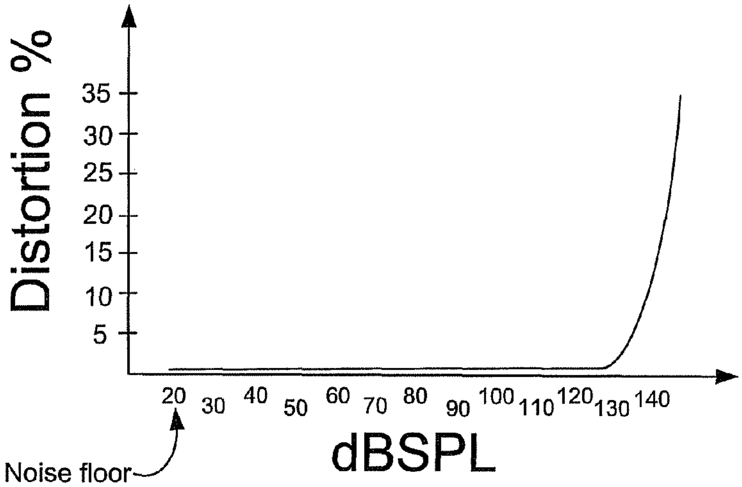

WIDE DYNAMIC RANGE MICROPHONE

RELATED APPLICATIONS

This patent application claims priority from provisional U.S. patent application No. 61/055,611, filed May 23, 2008, entitled "Wide Dynamic Range Microphone," the disclosure of which is incorporated herein, in its entirety, by reference.

FIELD OF THE INVENTION

The invention generally relates to MEMS microphones and, more particularly, the invention relates to improving the performance of MEMS microphones.

BACKGROUND OF THE INVENTION

Condenser MEMS microphones typically have a diaphragm that forms a capacitor with an underlying backplate. Receipt of an audio signal causes the diaphragm to vibrate to form a variable capacitance signal representing the audio signal. This variable capacitance signal can be amplified, recorded, or otherwise transmitted to another electronic device as an electrical signal. Thus the diaphragm and backplate act as a transducer to transform diaphragm vibrations into an electrical signal.

Microphone transducers typically have a limited dynamic range, defined as the difference between the weakest (in terms of sound pressure level) audio signal that the transducer can accurately reproduce (the bottom-end of the dynamic range), and the strongest audio signal that the transducer can accurately reproduce (the top-end of the dynamic range). The limited dynamic range of the transducer can limit the scope of applications for the microphone.

SUMMARY OF THE INVENTION

In accordance with one embodiment of the invention, a microphone system has plurality of transducers and selectively couples the system output among transducers to provide a dynamic range for the system that exceeds that of each individual transducer. A first transducer may have a dynamic range with a bottom-end that is lower than that of a second transducer, and is capable of producing a first output signal from relatively low-level audio signals. A second transducer may have a dynamic range with a top-end that is higher than that of the first transducer, and is capable of producing a second output signal from relatively higher-level audio signals. Other transducers, each with its own dynamic range, may also be included in the system. The dynamic range of each transducer overlaps with the dynamic range of at least one other transducer, so that for an audio signal of a given sound pressure level, that sound pressure level is within the dynamic range of at least one of the plurality transducers.

For purposes of clarity and simplicity in describing some of the fundamental concepts of the embodiments of the present invention, a microphone system with only two transducers or diaphragms will be discussed, with the understanding that more than two transducers or diaphragms may be used according to embodiments of the present invention.

In illustrative embodiments, the microphone system has two transducers. The dynamic range of the first transducer has a relatively low bottom-end so that it can accurately transduce audio signals of relatively low sound pressure. The dynamic range of the second transducer has a relatively high top-end so that it can accurately transduce audio signals of relatively high sound pressure. The dynamic ranges of the two transducers overlap, such that there is a level of sound pressure (or a range of sound pressures) that can be accurately reproduced as an electrical signal by either transducer or both transducers.

The microphone system may have a selector in some embodiments, so that the system or user can select between transducers depending on the incident sound pressure level. In this way, the microphone system can be made to capture the incident audio signal within the dynamic range of the selected transducer.

The microphone system also has a summing node or circuit in some embodiments. The summing node or circuit is operably coupled to the plurality of transducers such that the microphone system can provide a signal that is the sum (or weighted sum) of the output of several of the transducers. The microphone system may also have one or more amplifiers in some embodiments to amplify the output of one or more of the transducers so that all transducer outputs are of approximately the same amplitude, which will facilitate the smooth switching among them.

In accordance with another embodiment of the invention, at least two transducers may be MEMs diaphragms or transducers on a single die. In other embodiments of the invention, at least two transducers may be in a single package, or be in individual cavities within a single package. One or more transducers in some embodiments may form omni-directional microphones, while another one or more other transducers may form directional microphones.

A method of producing an output audio signal from a microphone system provides a plurality of transducers. The individual transducers may have dynamic ranges that are not identical. One embodiment of the method produces an output signal by selectively coupling the output of at least one of the transducers to an output terminal. In another embodiment, the method produces an output signal by summing the output of at least two transducers. An alternate embodiment of the method produces an intermediate output signal by summing the output of at least two transducers while transitioning (or fading) from the output of a first transducer to the output of a second transducer.

BRIEF DESCRIPTION OF THE DRAWINGS

The foregoing advantages of the invention will be appreciated more fully from the following further description thereof with reference to the accompanying drawings wherein:

FIG. 4A schematically illustrates the dynamic range of the first transducer of FIG. 3 (as one example), including an illustrative noise floor at the lower end of the scale, and illustrative increasing distortion at the upper end of the scale.

FIG. 4B schematically illustrates the dynamic range of the second transducer of FIG. 3 (as one example), including an illustrative noise floor at the lower end of the scale, and illustrative increasing distortion at the upper end of the scale.

FIG. 4C schematically illustrates the dynamic range of the microphone system of FIG. 3 (as one example).

DESCRIPTION OF ILLUSTRATIVE EMBODIMENTS

Figure 1:
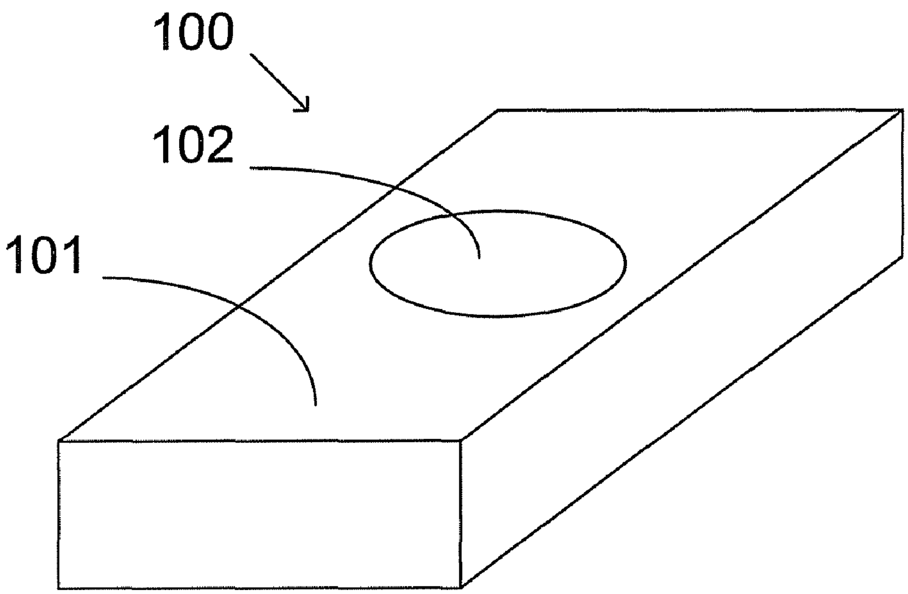
Figure 1: Prior Art
FIG. 1 schematically illustrates a prior art MEMS microphone diaphragm on a substrate.

In illustrative embodiments of the invention, a microphone system has an output and a plurality of transducers, and a selector to selectively couple at least one of the transducers to the output as a function of the amplitude of the incident audio signal, to provide a dynamic range for the microphone system that may exceed that of each individual transducer. To that end, the system may have a plurality of transducers with overlapping dynamic ranges to receive substantially the same incident audio signals. In illustrative embodiments of the invention, a method of operating the system may involve comparing the amplitude of the incident audio signal to a predetermined threshold, and determining which of a plurality of transducers to couple to the system output as a function of whether the amplitude of the incident audio signal is above or below a given threshold. The method may also change the threshold when it has been exceeded. Some methods may create and operate on delayed versions of the transducer outputs. Some methods may include equalizing the signals from the two transducers.

Various embodiments of this invention may employ, but are not necessarily limited to, MEMS microphones, or transducers on a common substrate. Each transducer has a diaphragm that acts, along with a backplate, as a transducer to reproduce the audio signal as an electrical signal output. In addition, each such transducer has a dynamic range defined as the range of sound pressure level between the smallest (lowest sound pressure) audio signal that the diaphragm can accurately reproduce and the largest (highest sound pressure) audio signal that this diaphragm can accurately reproduce. Audio signals may be measured by their sound pressure, and are commonly expressed in decibels of sound pressure level ("dBSPL").

The bottom-end of a transducer's dynamic range is determined primarily by electrical noise signals inherent in the transducer and the associated electronics. This electrical noise may be known as "Brownian" noise. The electrical signal output by the transducer includes a component representing the incident audio signal and a component representing the noise. If the amplitude of the noise signal approaches that of the audio signal, the audio signal may not be distinguishable from, or detectable from within, the noise. In other words, the noise may overwhelm the signal. The point where the noise signal overwhelms the audio signal is known as the noise floor, and the bottom-end of the dynamic range may be a function of the noise floor of the microphone. The amplitude of such noise may be a function of frequency, so a dynamic range may be different at different frequencies.

The top-end of a transducer's dynamic range may be determined by the distortion present in the output electrical signal. In an ideal microphone, the output will always be an undistorted copy of the incident audio signal. In real microphones, however, as the incident audio signal grows more powerful (i.e., high sound pressure level), the deflection of the diaphragm gets larger, and the electrical signal output from the transducer begins to distort because the mechanical-to-electrical conversion accomplished by the microphone becomes nonlinear. At some point, the level of distortion exceeds the system design tolerance, so sound pressure levels above that point fall outside the dynamic range of the transducer. The point of unacceptable distortion must be determined by the system designer as a function of the system being designed. Some applications may tolerate higher distortion than others. In some applications, distortion may become significant when the displacement of the diaphragm in response to an audio signal approaches ten percent of the nominal gap between the diaphragm and the backplate.

Thus, a transducer's dynamic range may be determined primarily by the noise floor at the bottom-end, and the point of unacceptable distortion at the top-end.

To improve the performance of the microphone system, the illustrative embodiments employ a plurality of transducers to collectively create a wider dynamic range than any one of the transducers might provide individually.

FIG. 1 schematically shows a conventional micromachined microphone 100, which is formed by a diaphragm 102 on a substrate 101. In some embodiments, the diaphragm 102 is suspended from the substrate 101 by one or more springs (not shown). Each spring may be attached to a point on the diaphragm 102 and a point on the substrate 101, or a point extending from the substrate 101. The diaphragm 102 forms a capacitor with an underlying backplate (not shown). Receipt of an audio signal causes the diaphragm 102 to vibrate to form a variable capacitance. In a circuit, the variable capacitance can act on an electrical input to produce an electrical signal representing the audio signal. This microphone 100 therefore acts as a transducer of the incident audio signal. This variable capacitance signal can be amplified, recorded, or otherwise transmitted to another electronic device as an electrical signal.

Figure 2:
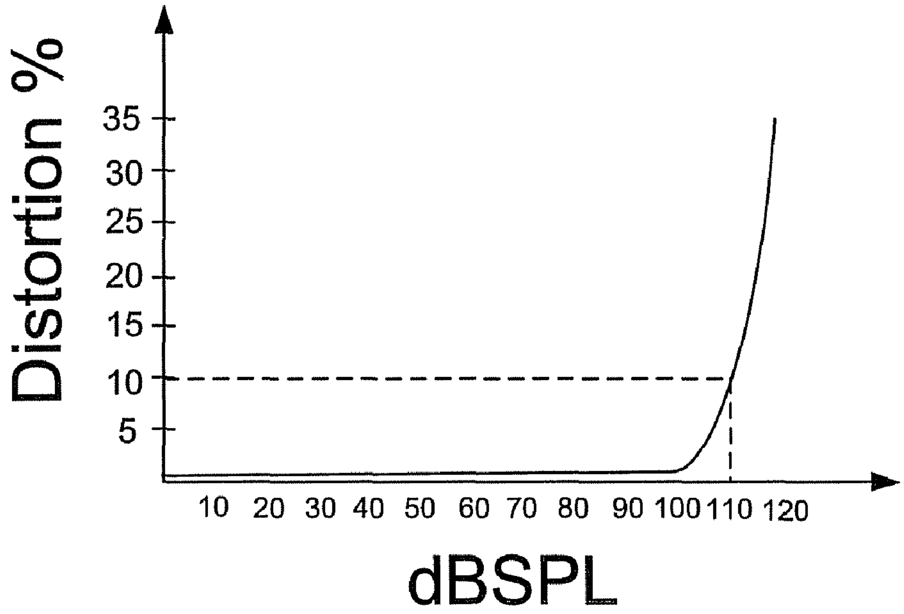
FIG. 2 schematically illustrates the dynamic range of a microphone transducer.

The fidelity of the response of the transducer 100 of FIG. 1 to incident audio signals at a variety of sound pressure levels is depicted in FIG. 2. The horizontal axis represents the sound pressure level of the audio signal, measured in dBSPL, or decibels of sound pressure level. The vertical axis represents the distortion of the transducer 100 output signal measure in percentage of total harmonic distortion.

At low sound pressure levels above the noise floor (the noise floor is not shown in FIG. 2), the transducer 100 reproduces the signal with little distortion. At higher sound pressure levels (e.g., above about 100 dBSPL), the signal begins to show some distortion, and the amount of distortion grows rapidly as the sound pressure level increases. At some point, the amount of distortion becomes unacceptable (based on the application). In FIG. 2, the distortion has reached approximately ten percent when the sound pressure level reaches about 110 dBSPL, as shown by the dotted lines in FIG. 2. If ten percent distortion is the maximum that the system will tolerate, then the top-end of the dynamic range for this microphone will be about 110 dBSPL. In illustrative embodiments, the top-end of the dynamic range for a transducer will be set at ten percent distortion, but another point could be chosen depending on the application.

Figure 3:
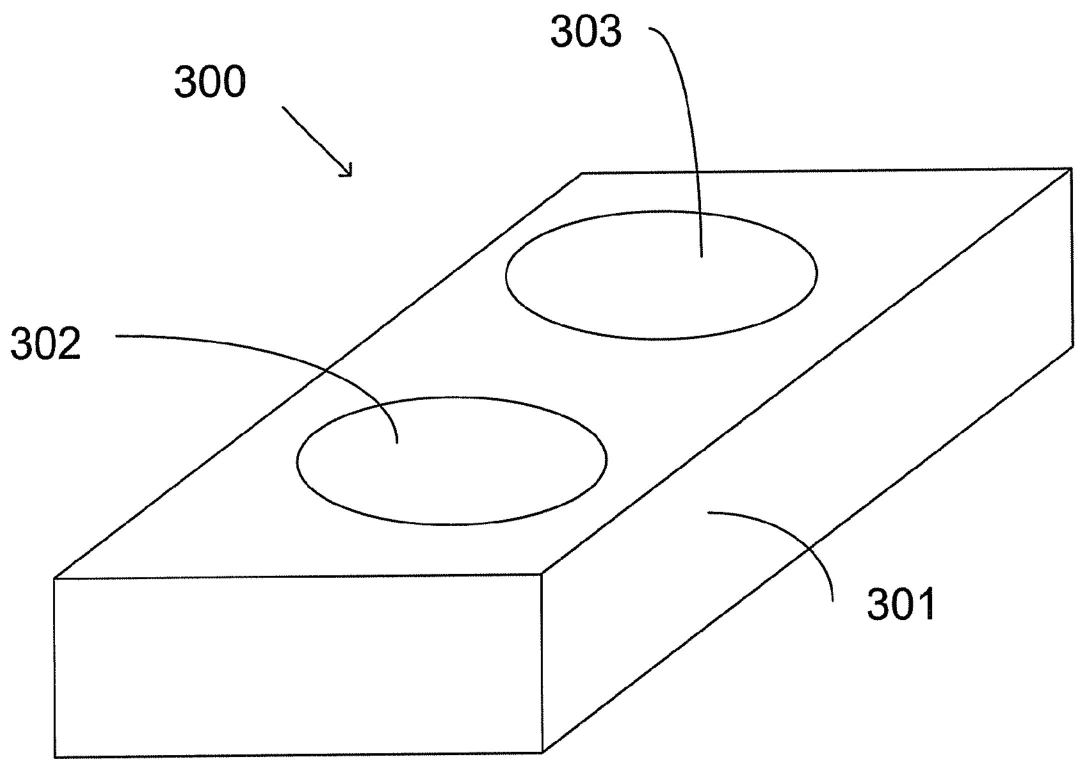
FIG. 3 schematically illustrates a MEMS microphone system having a first diaphragm and a second diaphragm in accordance with illustrative embodiments.

A microphone system 300 is schematically illustrated in FIG. 3, with a first transducer 302 and second transducer 303, both on a substrate 301. In accordance with illustrative embodiments, the two transducers 302 and 303 have different dynamic ranges. Accordingly, as discussed below, the transducers 302 and 303 provide a dynamic range for the system 300 that is greater than the dynamic range of either transducer alone. For example, if the noise floor of first transducer 302 is at 20 dBSPL, and the top-end of the dynamic range of second transducer 303 is 140 dBSPL, and if the dynamic ranges of the two transducers overlap at any point, then the dynamic range of the two-transducer system 300 can be made to extend from 20 dBSPL to 140 dBSPL by selecting as the system output the output of one or the other of the transducers, depending on which transducer is producing an output within its individual dynamic range.

The responses to incident audio signals over a range of sound pressure levels for the transducers and the system are shown in FIGS. 4A, 4B and 4C, respectively. FIG. 4A schematically shows the response of the first transducer 302 of FIG. 3 to incident audio signals over a range of sound pressure levels. As shown, the first transducer 302 has a noise floor at about 20 dBSPL, so that no signals below about 20 dBSPL will be detectably reproduced by the first transducer 302. The first transducer 302 reaches a distortion of ten percent at a sound pressure level of about 110 dBSPL. Accordingly, if ten percent (10%) is the maximum allowable distortion, the dynamic range of first transducer 302 extends from about 20 dBSPL to about 110 dBSPL.

Similarly, the response of the second transducer 303 of FIG. 3 to incident audio signals over a range of sound pressure levels is shown in FIG. 4B. The second transducer 303 has a noise floor at about 50 dBSPL, so that no signals below about 50 dBSPL will be detectably reproduced by the second transducer 303. The second transducer 303 reaches a distortion of ten percent at a sound pressure level of about 140 dBSPL. Accordingly, if ten percent (10%) is the maximum allowable distortion, the dynamic range of the second transducer 303 extends from about 50 dBSPL to about 140 dBSPL.

FIG. 4C schematically shows the response of the microphone system 300 of FIG. 3 to incident audio signals over a range of sound pressure levels according to one embodiment of the present invention. For audio signals above about 20 dBSPL but below about 110 dBSPL, the output of the first transducer 302 may be selected as the system output. For audio signals above about 50 dBSPL but below about 140 dBSPL, the output of the second transducer 303 may be selected as the system output. For audio signals between about 50 dBSPL and about 110 dBSPL, output of either the first transducer 302 or the second transducer 303 may be selected as the system output. By selectively coupling the system output to the outputs of the first transducer 302 and the second transducer 303 as a function of incident sound pressure level, and if ten percent (10%) is the maximum allowable distortion, the microphone system 300 may act as a transducer for signals ranging from about 20 dBSPL up to about 140 dBSPL. In other words, the dynamic range of the system 300 extends from about 20 dBSPL to about 140 dBSPL.

A number of different techniques may be implemented to selectively couple the output of transducers 302 and 303 to the system output. For example, in one embodiment, the sound pressure level of the incident audio signal is monitored to determine when it exceeds or crosses a threshold. The incident audio signal may be monitored, for example, by monitoring the response of one of the transducers, or by monitoring the system output, or by monitoring the output of a sensor dedicated to that purpose.

In some embodiments, the sound pressure level of the monitored signal is compared to the threshold value, and a determination is made about which transducer or transducers should be coupled to the output.

In some embodiments, the monitored signal may be monitored by circuitry on the same substrate, or in the same package as, the transducers. For example, a comparator may compare the monitored signal to a threshold voltage. In some embodiments, the threshold voltage may be set by a user of the microphone, or may be supplied by another part of the system in which the microphone is used.

In some embodiments, the monitored signal may be monitored by external circuitry, for example by a comparator, or by a digital signal processor adapted to receive and process a sampled copy of the monitored signal. In some embodiments, the threshold value may be stored in digital form in a register or memory location accessible to the digital signal processor. In some embodiments, the threshold value may be set by a user of the microphone by, for example, setting or changing the data stored in such a register or memory location.

Figure 5:
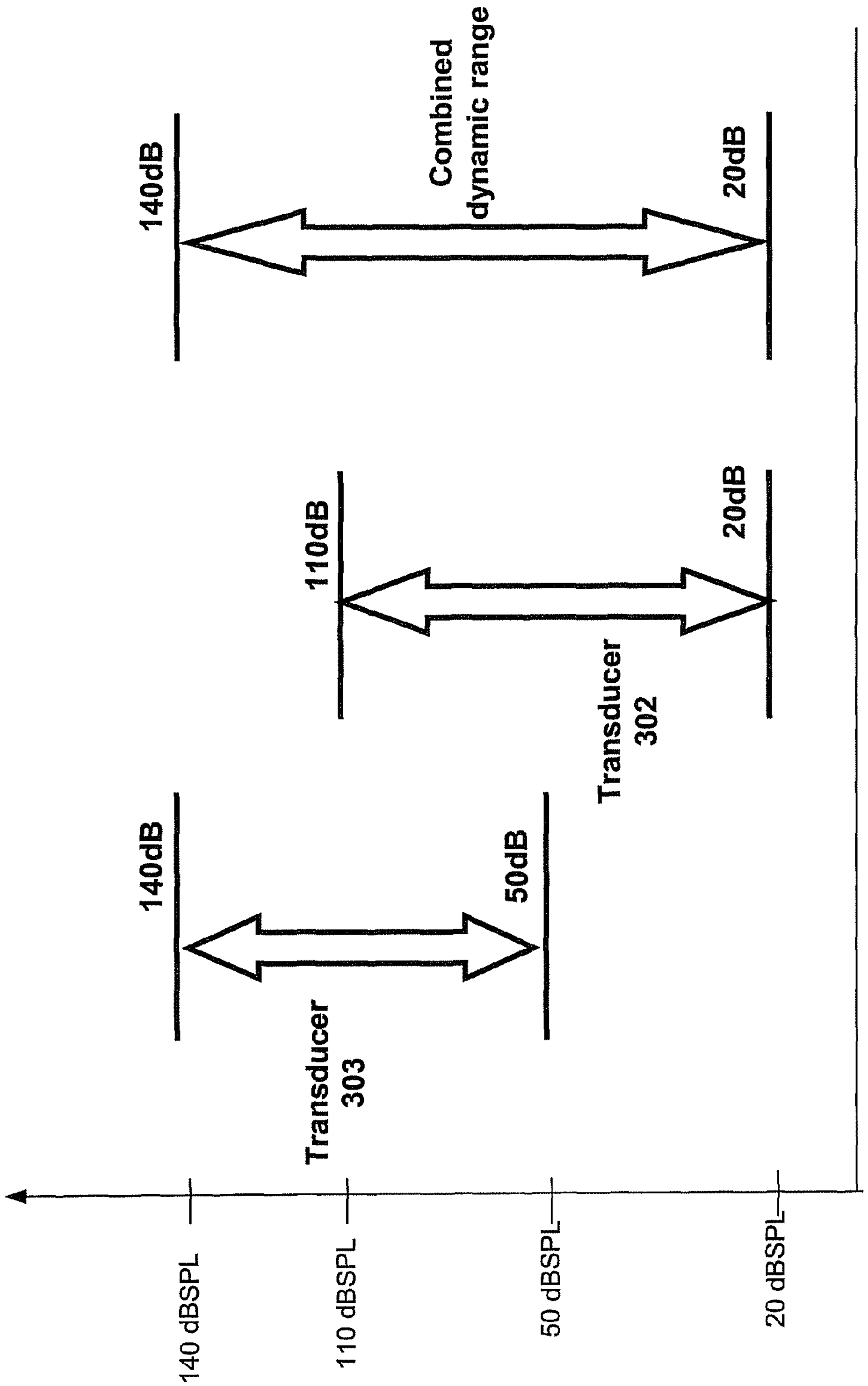
FIG. 5 schematically illustrates the individual dynamic ranges of the transducers of FIG. 3 (as one example), and the combined dynamic range of the microphone system of FIG. 3.

The threshold may change, in some embodiments, depending on which transducer has its output coupled to the system output. For example, as illustrated in FIG. 5, in some embodiments a system may include two transducers with overlapping dynamic range, in which one transducer has a dynamic range with a top end at 110 dBSPL, and a second transducer with a dynamic range with a top end at 140 dBSPL. If the output of the first transducer is coupled to the system output, and the sound pressure increases to near 110 dBSPL for example, the system may switch the connections so as to decouple the output of the first transducer from the system output, and to couple the output of the second transducer to the system output. The threshold for triggering such a change may be at, for example, 100 dBSPL—below the top end of the first transducer's dynamic range, but still within the overlap of the two dynamic ranges.

Once the transition is made, and the output of the second transducer is coupled to the system output, it may be desirable to change or reset the threshold. For example, it may be desirable to avoid having the system transition back to the first transducer if the audio signal momentarily drops to less than the above-mentioned 100 dBSPL threshold. Therefore, the threshold may be lowered, for example to 90 dBSPL. Similarly, if the system does transition back to the first transducer, the threshold may be increased, for example, back to 100 dBSPL. As such, when the system transitions from one transducer to another, the threshold may be contemporaneously changed or reset. In some embodiments, the threshold, or thresholds, may be anywhere within the overlap of the transducers' dynamic ranges. Alternate embodiments are discussed in connection with FIG. 8B In alternate embodiments, the selective coupling may occur as soon as the comparison is completed, or it may be delayed for some time, or until the comparison can be confirmed by one or more successive measurements. In other words, in some embodiments the decision to change the coupling may occur only after the signal has exceeded (or fallen below) the applicable threshold for a predetermined amount of time.

When switching between transducers, some switching artifacts may audibly manifest themselves. For example, a difference in output signal level between two transducers, or different DC offset levels between two transducer outputs, may cause artifacts such as "pops" or "clicks." Unequal signals are preferably avoided because a difference in amplitude may appear on the system output when changing the coupling to the system output from one transducer to another. Such a difference could manifest itself, for example, as a perceptible change in audio volume that is unacceptable to the user. Differences in transducer DC offsets are also preferably avoided. In the analog domain, AC coupling can block the DC offset, but the size of the necessary coupling capacitors may be too large to efficiently integrate onto an integrated circuit. In the digital domain, a high pass filter can be used to the same effect. Switching artifacts, such as the above examples, may be addressed in a variety of ways, although not all of the approaches address all switching artifacts. Some embodiments may combine one or more of the approaches discussed below, or may combine one or more of these with other methods. In some embodiments, one or more process steps may be combined into a single step.

To address switching artifacts, in some embodiments the outputs of one or more transducers may be combined or summed, and the sum provided as the output in some embodiments of the microphone system. This may be done as part of transitioning from one transducer output to the other.

In some embodiments, the outputs of one or more transducers may also be combined in a weighted sum, with one transducer output weighted more heavily than the other, and the sum provided as the output of the microphone system. In this way, one of the transducer outputs will be the dominant component of the system output. In an alternate embodiment, the weighting of the respective transducer outputs in the sum may be changed over time, so as to produce a fade (or "cross-fade") from one transducer output to another. Such a cross-fade for two transducers may be described by the following equation:

$$\text{System Output}=k*\text{Transducer 1}+(1-k)*\text{Transducer 2}$$

where "k" is the weighting factor, and changes over time. In one embodiment, for example, "k" may be changed from one to zero over a period of 20 ms, so that the system output is initially composed entirely of signal from Transducer 1, but the system output is finally composed entirely of signal from Transducer 2, while in the interim the system output is a weighted sum of signals from Transducer 1 and Transducer 2.

Figure 11A:
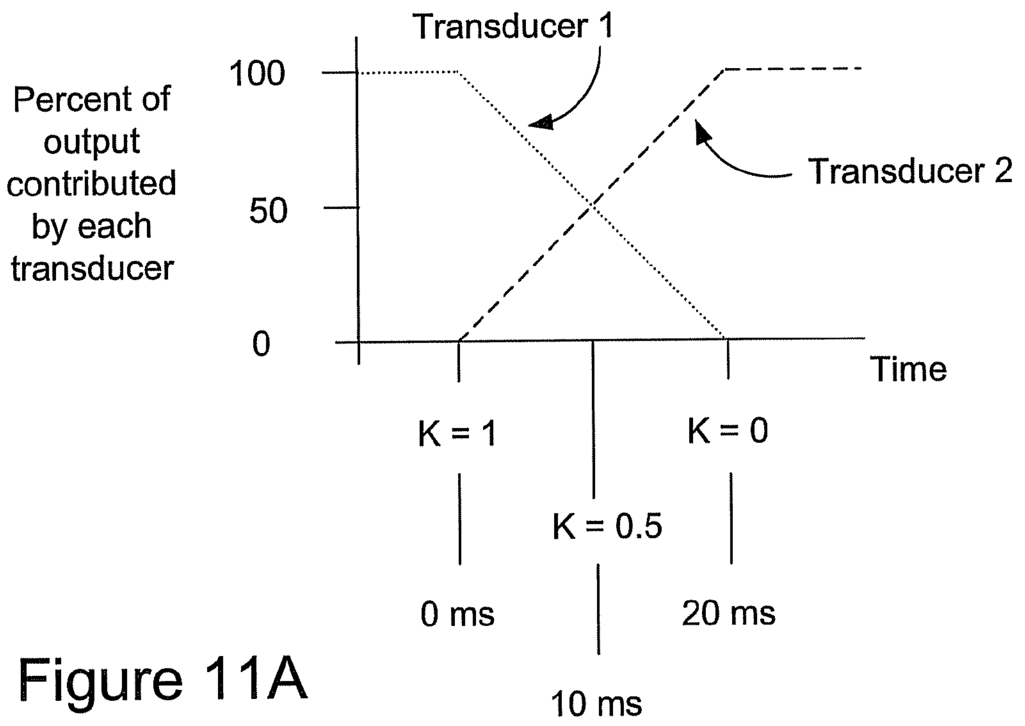
FIG. 11A schematically illustrates a cross-fade operation performed as a function of time.

In some embodiments, a cross-fade can be used to reduce the audibility of switching artifacts due to, for example, amplitude differences and DC offsets. For example, a 20 ms cross-fade could be implemented in either the analog or digital domain. Such an embodiment is illustrated in FIG. 11A, in which the output of the system is composed entirely of the output of Transducer 1 prior to the beginning of the cross-fade at time 0 (where k=0), but is composed entirely of the output of Transducer 2 after 20 ms. In the interim, the system output is composed of a weighted sum of the two transducer outputs, e.g., each transducer contributes approximately fifty-percent of the output after 10 ms of transition, when k=0.5.

In some embodiments, the transition time of a cross-fade my depend on whether the input audio signal is rising or falling in intensity. For example, in a system that is incurring an input signal with a rapidly rising amplitude, it may be desirable to switch the system output from a first transducer to a second transducer in a short amount of time (e.g., less than 20 ms). Conversely, switching from (or back from) the second transducer to the first transducer may not require such rapid action, so a longer cross-fade may be implemented.

Figure 11B:
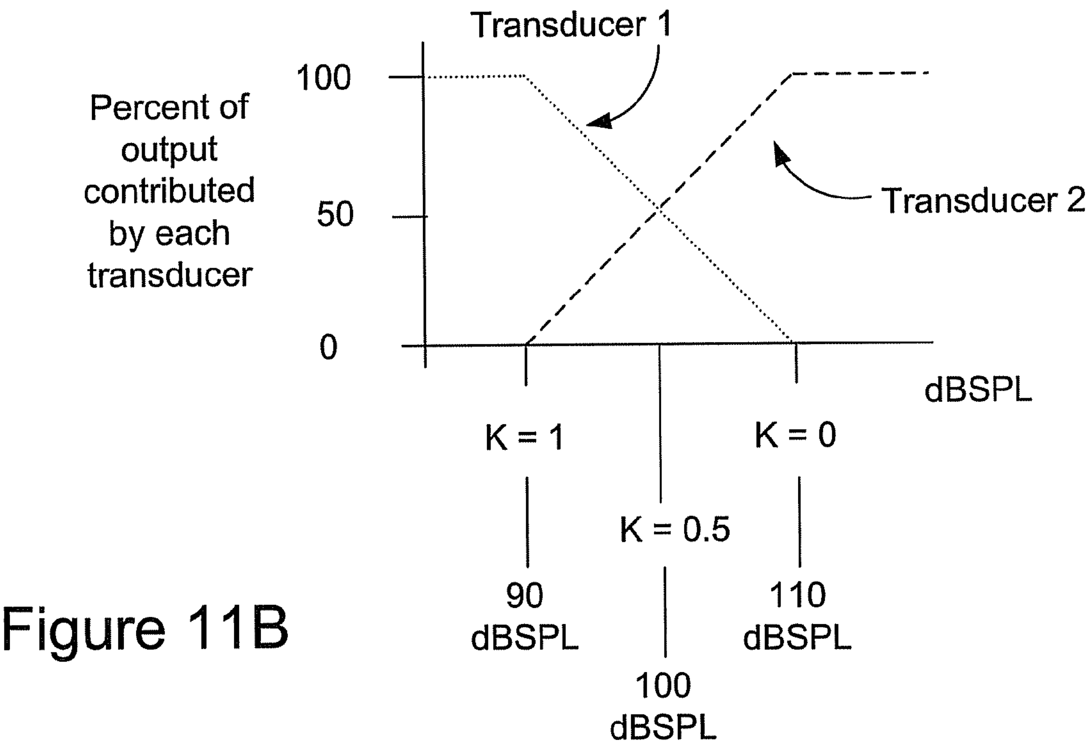
FIG. 11B schematically illustrates a cross-fade operation performed as a function of signal amplitude.

A cross-fade may be implemented as a function of the amplitude of the audio signal, in alternate embodiments. In such an embodiment, for example, "k" may be changed from one to zero (or zero to one) as a function of the amplitude of the audio signal. Relatively small signals would still be entirely processed by one transducer (e.g., transducer 1 when k=1), while relatively larger signals would still be processed by another transducer (e.g., transducer 2 when k=0). However, signals within a portion of the overlap of the two transducers' dynamic ranges could be output as a sum or weighted sum of the two transducers' individual outputs (e.g., k=0.5, where k is a function of the amplitude of the signal). Such an embodiment is illustrated in FIG. 11B, in which the contributions of the two transducers to the system output vary as a function of the sound pressure level of the incident audio signal. For example, when the incident audio signal is less than 90 dBSPL, the output of the system is composed entirely of the output of Transducer 1. However, when the incident audio signal is greater than 110 dBSPL, the output of the system is composed entirely of the output of Transducer 2. When the incident audio signal is greater than 90 dBSPL but less than 110 dBSPL, the system output is composed of a weighted sum of the two transducer outputs, e.g., each transducer contributes approximately fifty-percent of the output when the incident audio signal is approximately 100 dBSPL, when k=0.5.

Figure 12A:
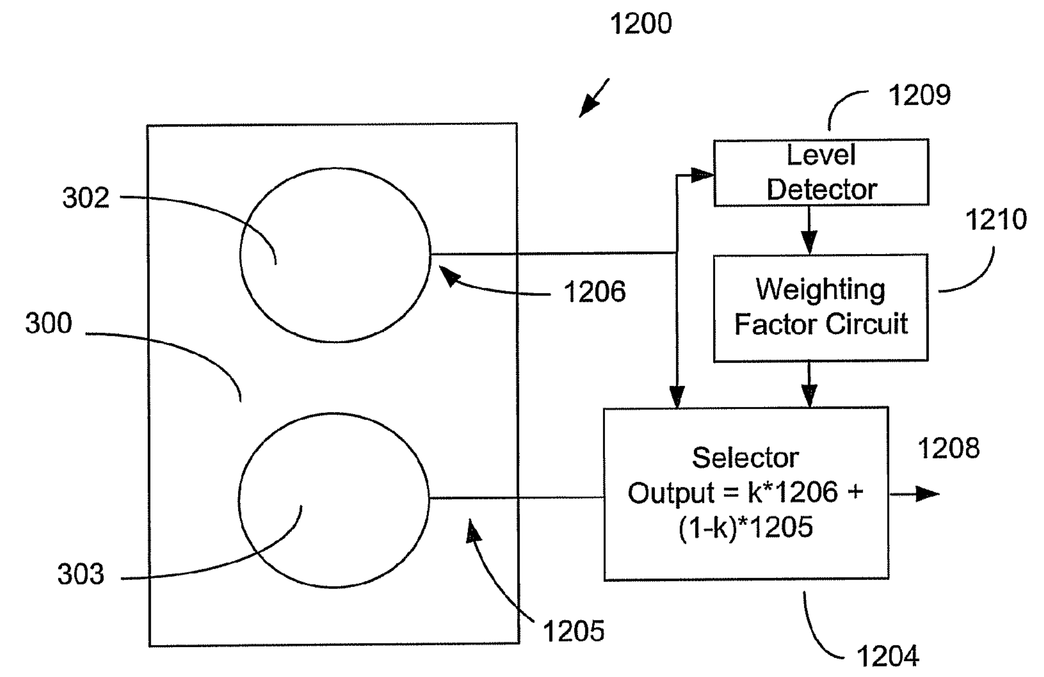
FIG. 12A schematically illustrates a microphone system using feed-forward amplitude control of a weighting factor.
Figure 12B:
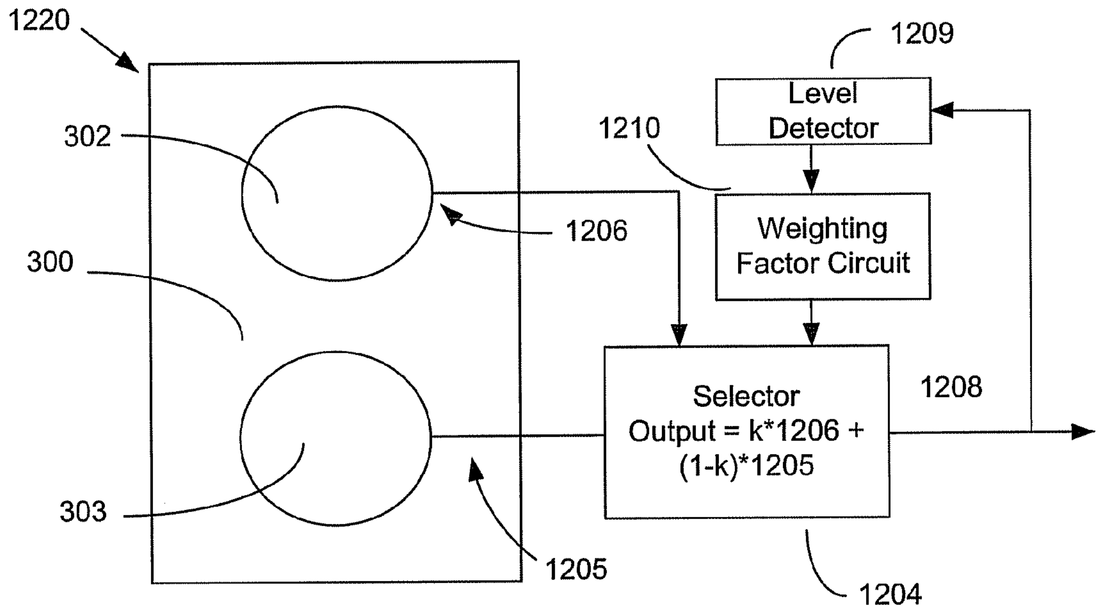
FIG. 12B schematically illustrates a microphone system using feedback amplitude control of a weighting factor.

Illustrative embodiments of such systems are shown in FIGS. 12A and 12B. FIG. 12A schematically illustrates a feed-forward system 1200, in which the output 1206 of transducer 302 is provided to both the selector 1204 and a level detector 1209. The level detector determines whether the signal is between the thresholds, and sets the weighting factor (k) using weighting factor circuit 1210. The weighting factor is output by the weighting factor circuit 1210 to the selector 1204. The selector produces an output signal 1208 as a weighted sum of its two inputs, 1205 and 1206, as a function of the weighting factor. FIG. 12B schematically illustrates a feedback system 1220 that operates substantially similar to the feed-forward system of FIG. 12A, except that the input to the level detector 1209 is taken from the selector output 1208.

In such an embodiment, the system may establish the weighting factor ("k") as a function of the amplitude of the incident audio signal. For example, if the amplitude is exactly in-between the thresholds, the system may set the weighting factor to 0.5. If the amplitude is closer to the lower threshold, the system may set the weighting factor to a point between 1 and 0.5 (e.g., if the amplitude is above the lower threshold by twenty five percent of the difference between the lower threshold and the upper threshold, the system may set the weighting factor to 0.75 (e.g., 1−0.25=0.75). If the amplitude is closer to the upper threshold, the system may set the weighting factor to a point between 0.5 and 0 (e.g., if the amplitude is above the lower threshold by eighty percent of the difference between the lower threshold and the upper threshold, the system may set the weighting factor to 0.2 (e.g., 1−0.80=0.2).

In some embodiments, at least one transducer output may be amplified before being switched to the system output, or to a summing junction. In this way, the signal amplitudes at the outputs of the transducers may be made substantially equal for any given input audio sound pressure level.

Some switching artifacts may be avoided by timing the switching action to occur substantially simultaneously with a zero-crossing of the signal (e.g., when the signal has an amplitude of zero volts). For example, when the signal amplitude is zero volts, differences in gain between one microphone and the other do not impact the amplitude. As such, switching artifacts arising from differences in signal amplitude between the transducers may be minimized or avoided.

Figure 13A:
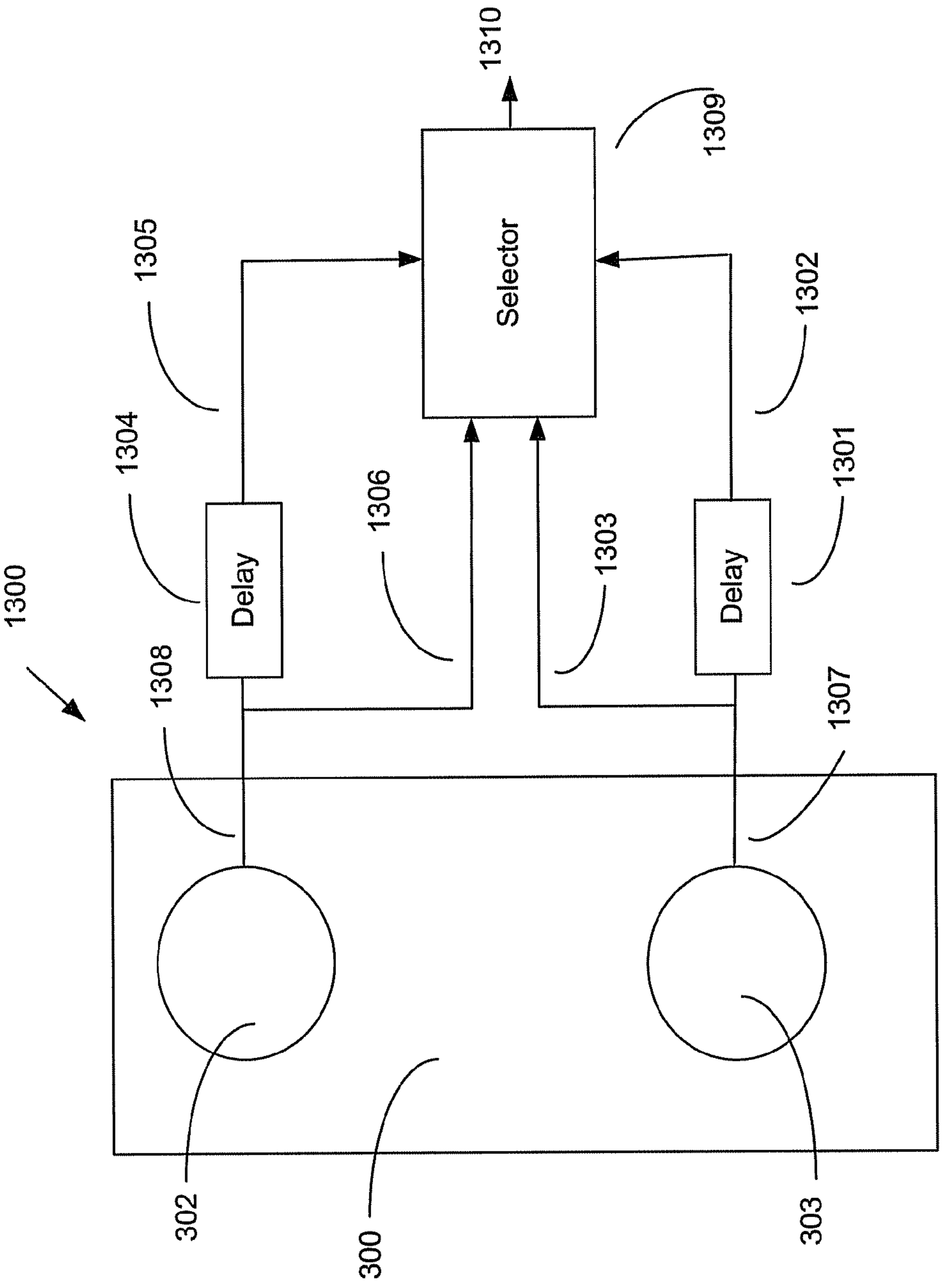
FIG. 13A schematically illustrates a microphone system adapted to produce an output based on delayed transducer signals.
Figure 13B:
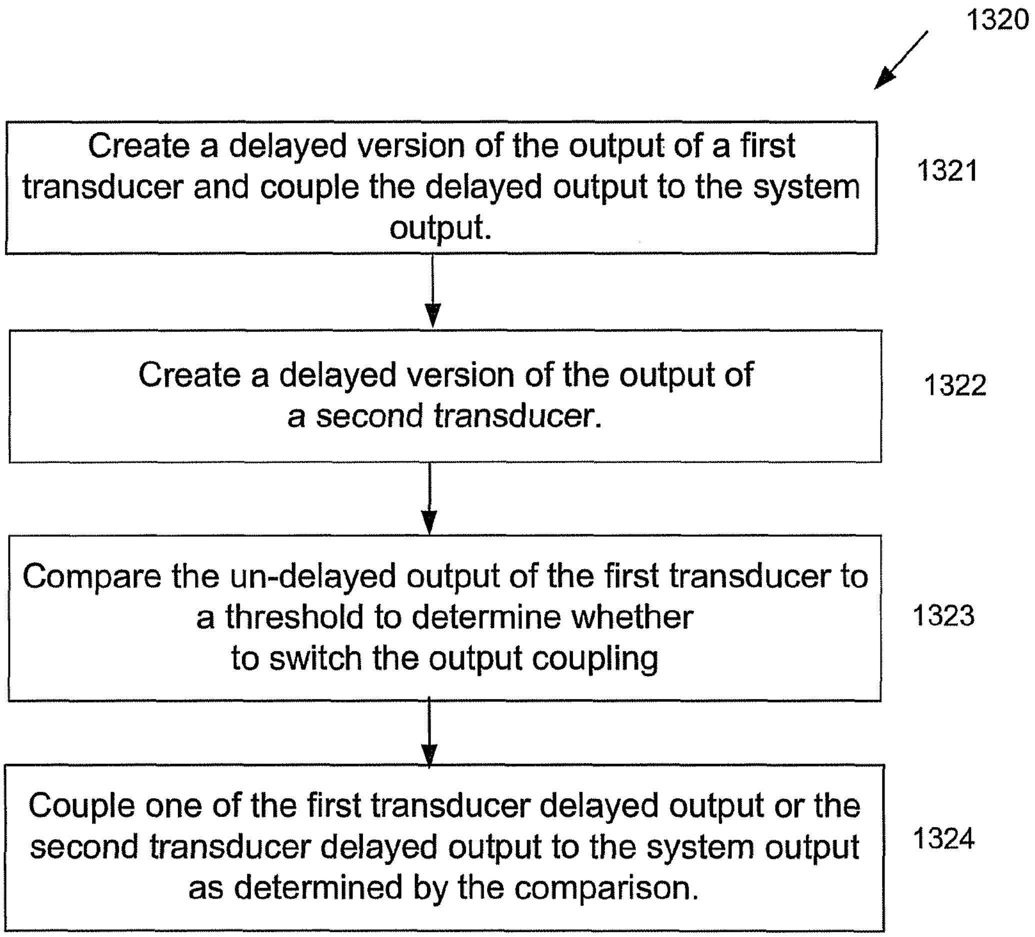
FIG. 13B illustrates a method of switching between delayed transducer outputs.

To facilitate selective coupling, one copy of the output signal of one or more transducers may be delayed, while an un-delayed signal is processed and/or compared to the threshold. A circuit for such an embodiment is schematically illustrated in FIG. 13A, which includes delay blocks 1301 and 1304, which produce delayed signals 1302 and 1305 from transducer outputs 1307 and 1308, respectively. A flow chart for such an embodiment is illustrated in FIG. 13B, where the delayed signals are created at steps 1321 and 1322, respectively. Typically, one of the delayed signals is coupled through to the system output, for example delayed signal 1305 in FIG. 13A, at step 1321 in FIG. 13B. Delay blocks 1301 and 1304 may be implemented in ways known in the art, such as RC analog delay lines, or with A/D and D/A converters and data memory.

When the un-delayed signal (for example, 1306 in FIG. 13A) has been compared to a threshold (1323), the selection of the system output may be made from among the delayed transducer signals 1302 and 1305, and the selected signal may be coupled (1324) to the system output 1310. In such an embodiment, the circuitry of selector 1309 has time to react to a rapidly rising or falling transducer output signal level, and the selection can be made and implemented before the selected delayed signal reaches the output 1310. The process may then be continuously repeated, and the circuit adjusted accordingly with each repetition.

If the delay is long enough to implement a cross-fade, then a cross-fade may be used to complete the change before the delayed signal reaches the system output. For example, in an application where the audio signal has been small (low sound pressure level) and suddenly gets large (high sound pressure level), the system output will initially be comprised entirely of the delayed output of the more sensitive transducer (in this example, "T1*d*," where the "d" indicates that this is the delayed output of the transducer T1), with no contribution from the other transducer (in this example, "T2*d*," where the "d" indicates that this is the delayed output of the transducer T2), so that the system output would be weighted as follows, according to the foregoing formula (with k=1):

$$\text{System Output}=1*T1d+(1-1)*T2d=T1d$$

In this example, the cross-fade may begin as soon as the system detects that the signal becomes large (since the cross-fade logic operates from the un-delayed signal), since the output of the more sensitive transducer (T1) may begin to distort (e.g., clip), but the other transducer (T2) will be comfortably within its dynamic range and will be producing an undistorted signal. If the signal delay is at least as long as the cross-fade time, then by the time the distorted signal from T1 would have appeared at the system output, the weighting factor ("k") will have reached zero and the system output will be entirely comprised of the output of the second transducer (T2*d*), according to the foregoing formula (with k=0):

$$\text{System Output}=0*T1d+(1)*T2d=T2d$$

Accordingly, the distorted signal will not have reached the system output.

In applications in which a delay is impractical to implement (as it may be in the analog domain, for example) or if the application will not tolerate a delay, an alternate embodiment may address switchover artifacts with background calibration. If the difference between the gain path of two transducers (i.e., the path between the transducer output and the system output) is known, then a gain element may be implemented in one signal path to equalize the gain (such as amplifier 705 in FIG. 7). For example, if a given audio signal produces an output of "X" from one transducer, and an output of "Y" from a second transducer, then ideally X=Y (or X−Y=zero). However, if the gain in the signal path of the first transducer (i.e., the path from the output of the first transducer to the system output) is greater than the gain in the signal path of the second transducer, then a signal from the second transducer could be amplified by a factor "G", so that X=GY.

In a digital implementation, the value of G can be determined using an iterative adaptive approach, by comparing signal levels from different transducers. For example, the update of the gain factor "G" can be iteratively determined from the following formula:

$$G\_new=G\_old+alpha*(X-G\_old*Y)$$

where:

"alpha" is an adaptation factor, such as 0.001;

G_new is the gain factor being determined;

G_old is the previous gain factor;

X is a sample of the signal from the first transducer; and

Y is a sample of the contemporaneous signal from the second transducer.

Through one or more iterations, a value of G will be determined such that the two signal paths produce signals of substantially the same amplitude for a given input audio signal.

In the analog domain, an analog gain-adjustment method could be implemented, for example, using continuously-adjustable gain cells, or a tapped resistor string around an op-amp that can make very small gain adjustments. In one embodiment, the gain factor "G" can be continuously determined through the use of an integrator with the following transfer function:

$$G=alpha\int(X-GY)dt$$

where:

"alpha" is an adaptation factor, such as 0.001;

G is the gain factor;

X is the signal from the first transducer; and

Y is the signal from the second transducer.

The output of one or more transducers may be provided in parallel so that, in such an embodiment, other parts of a larger system may process the signals. For example, as discussed above, the signals may be monitored by a comparator or digital signal processor.

One application for the microphone system might be in a mobile telephone. Specifically, a telephone may require a microphone that can withstand the relatively high sound pressure levels of a human voice speaking a few centimeters from the transducer. Other potential operating conditions of a mobile telephone may expose the microphone system to high sound pressure levels from, for example, amplified music, wind noise while in outdoor use, or other environmental sounds. Such a microphone, sometimes called "near-field" microphone, preferably has a dynamic range with a top-end high enough to accurately reproduce a loud sound. Such a microphone would not require a dynamic range with a particularly low bottom-end because the sound of concern will be loud enough to exceed the noise floor of the microphone.

If a mobile telephone also includes a speaker-phone capability or a video camera, for example, it may be required to detect and accurately reproduce sounds that originate farther away than the mouth of a person speaking directly into a mouthpiece. Because sound pressure level decays rapidly over distance, the sound pressure level of a sound from a distant source will possibly be less than that from a human voice speaking a few centimeters from the transducer. Accordingly, such a telephone would preferably include a microphone that could accurately reproduce audio signals of a relatively low sound pressure level. Such a microphone, sometimes called “far-field” microphone, preferably has a dynamic range with a low bottom-end, including a low noise floor. Typically, a microphone that can reproduce audio signals with low sound pressure levels will not also be able to effectively reproduce audio signals with high sound pressure levels. In other words, a single microphone may not have a dynamic range suitable for acting as a transducer for both low sound pressure levels and high sound pressure levels. Some embodiments may include, among other things, a near-field microphone that is directional, and a far-field microphone that is omni-directional. In a telephone that can be used as both a telephone and a speaker phone, the directional near-field microphone may be used to process audio signals from a telephone user speaking directly into the phone, while avoiding background audio noise, and the far-field microphone may used while in speakerphone mode, to process sounds from a variety of sources that may not be immediately proximate the microphone system.

An alternate illustration of the dynamic range of the microphone system 300 is shown in FIG. 5, which shows the dynamic range of the first transducer 302 as a double-headed arrow extending from a low of about 20 dBSPL to a high of about 110 dBSPL, and the second transducer 303 as a double-headed arrow extending from about 50 dBSPL to about 140 dBSPL. The dynamic range of the system 300 according to an embodiment of the present invention is shown as a double-headed arrow with dynamic range extending from about 20 dBSPL to about 140 dBSPL representing the combined dynamic range of the individual transducers 302 and 303. Some embodiments may have more than two transducers of varying overlapping dynamic ranges.

Figure 6:
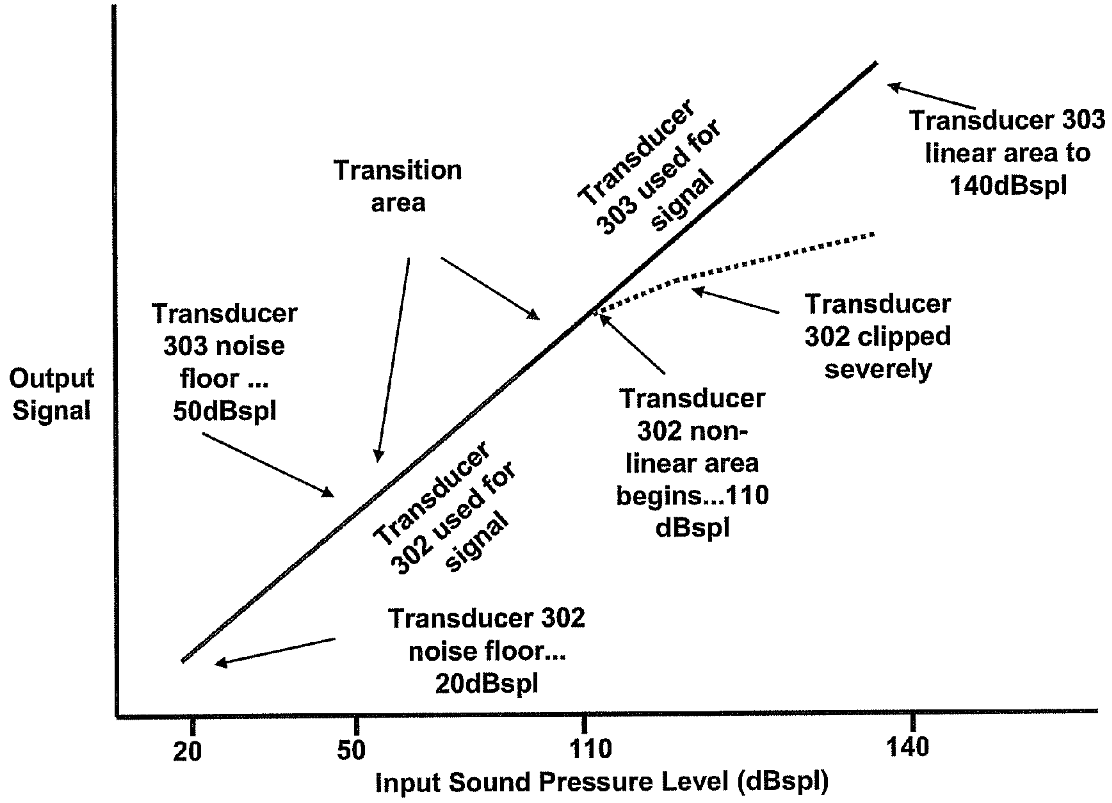
FIG. 6 schematically illustrates the combined-transducer output of the system of FIG. 3 (as one example).

The graph of FIG. 6 represents the output of a microphone system 300 including two transducers according one embodiment of the present invention. The first transducer 302 is used for the lowest sound pressure level signals (for example, a far-field microphone), while the second transducer 303 is used for higher sound pressure level signals (for example, a near-field microphone). As the sound pressure level increases (along the X axis), the response of the transducers also increases in a substantially linear fashion. The microphone system 300 changes the coupling to the output from the first transducer 302 to the second transducer 303, illustratively at about 90 dBSPL or 100 dBSPL. The transition preferably occurs at a sound pressure level that is within the overlapping dynamic ranges of transducers 302 and 303. As illustrated in FIG. 6, the transition range is below the point where the output of the first transducer 302 begins to distort (in this illustration, it becomes non-linear) but above the bottom of the dynamic range of the second transducer 303. The result is a microphone system 300 with a substantially linear output over a range of sound pressure levels that is greater than the dynamic range of any one of the transducers 302 and 303 alone.

Figure 7:
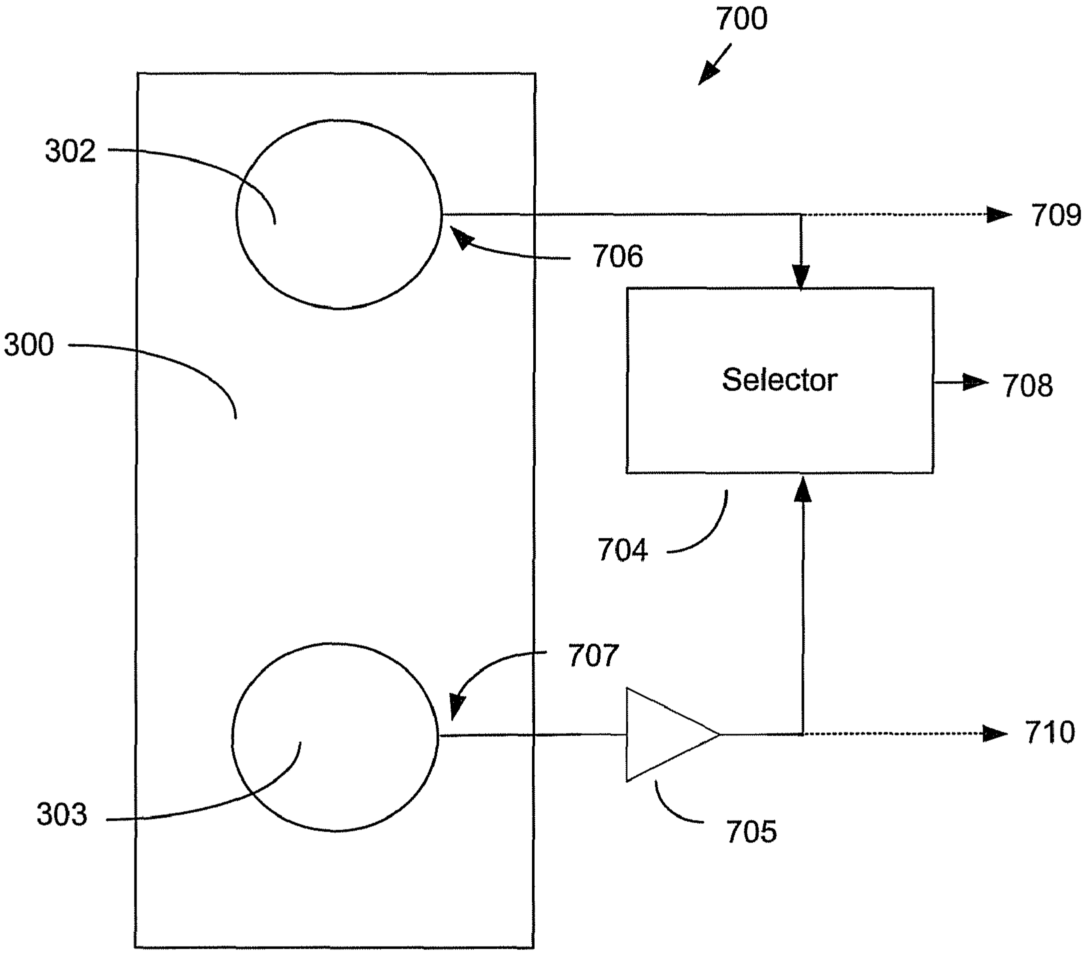
FIG. 7 schematically illustrates a microphone system including the microphone of FIG. 3, a selector, and an amplifier.

FIG. 7 schematically shows a microphone system 700 having first transducer 302 with a first transducer output 706, and second transducer 303 with a second transducer output 707 (transducers 302 and 303 correspond to the transducers in FIG. 3), a selector 704 for selectively connecting one of the two transducers to its output 708, and an optional amplifier 705 to amplify or buffer the output 707 of transducer 303. The selector 704 may be a switch that simply passes one signal or another to the output. Alternately, the selector 704 may be a junction or node that combines part or all of a plurality of transducer output signals to produce the system output signal to system output 708. The selector may be controlled to produce a weighted sum of signals, and also to change the weighting over time to produce a cross-fade from one transducer output to another. The operation of the selector could be implemented in the analog or digital domain. FIG. 7 also shows outputs from each transducer provided to output terminals 709 and 710 as raw output signals without passing through the selector 704, so that the system user can select or combine them in other ways. The output signals may be provided directly, as illustrated for example by output terminal 709, or buffered or amplified as illustrated for example by the signal output on the output terminal 710.

Figure 8A:
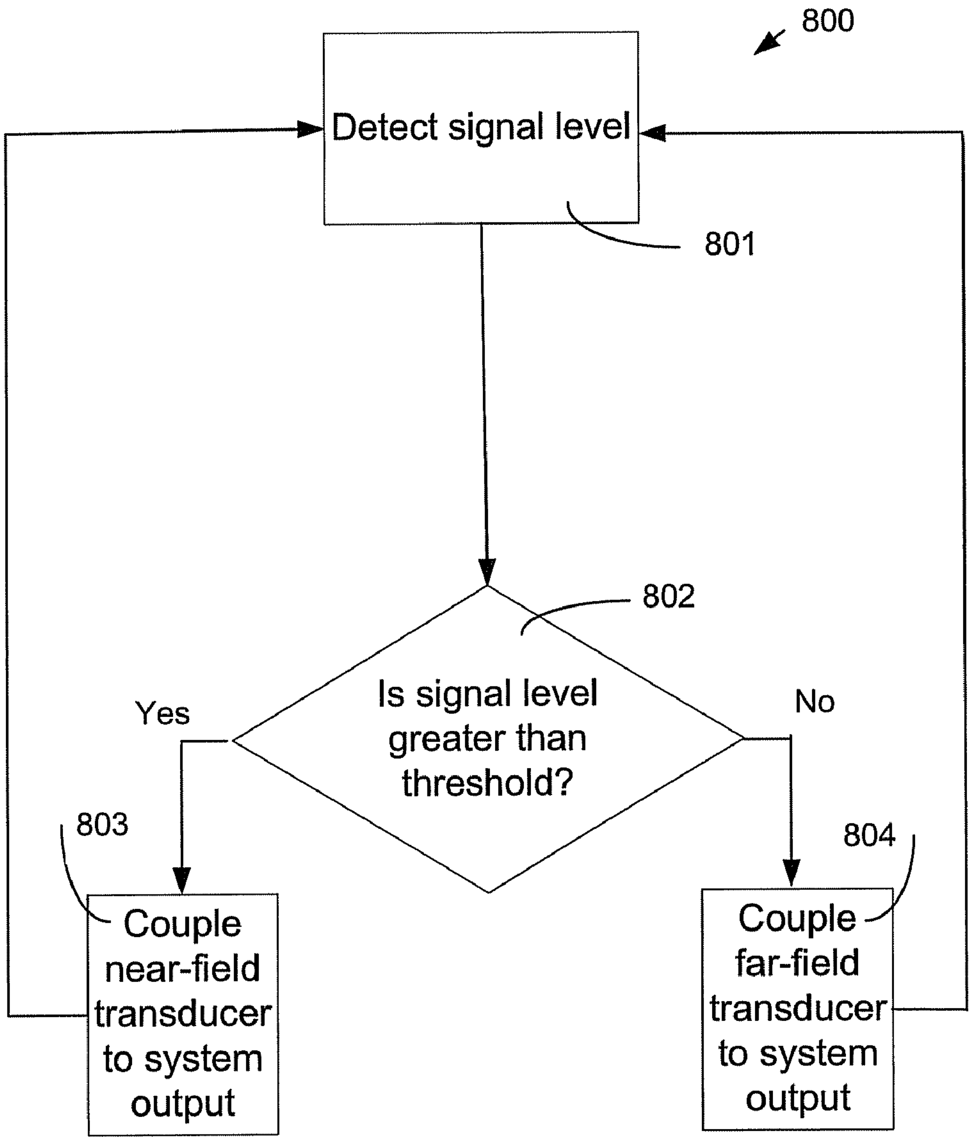
FIG. 8A shows a method of switching from one transducer to another as sound pressure level changes in accordance with an illustrative embodiment.

A method 800 of switching from one transducer to another as sound pressure level changes is illustrated in FIG. 8A. The process begins at step 801, which detects the sound pressure level. Among other ways, this may be done by monitoring the output of one or more of the transducers, or by using a separate transducer adapted to this purpose. At step 802, the electrical signal corresponding to the detected sound pressure level is compared to a threshold. There may be a plurality of threshold values, such as one threshold value to determine whether to switch from the first transducer to the second transducer as sound pressure increases, and a second threshold value to determine whether to switch from the second transducer to the first transducer as the sound pressure decreases. The comparison may be done by analog or digital methods known in the art, such as through the use of analog comparators in the analog domain, or in the digital domain either by the use of digital comparators or a digital signal processor operating on a digital version of the signal produced by an analog to digital converter. The comparison may be based on an instantaneous reading of the signal, or based upon a time-average or integration of the signal. If the sound pressure level exceeds the threshold, the output of the near-field transducer is coupled to the system output at step 803. If the sound pressure level is below the threshold, the output of the far-field transducer is coupled to the system output at step 804.

Figure 8B:
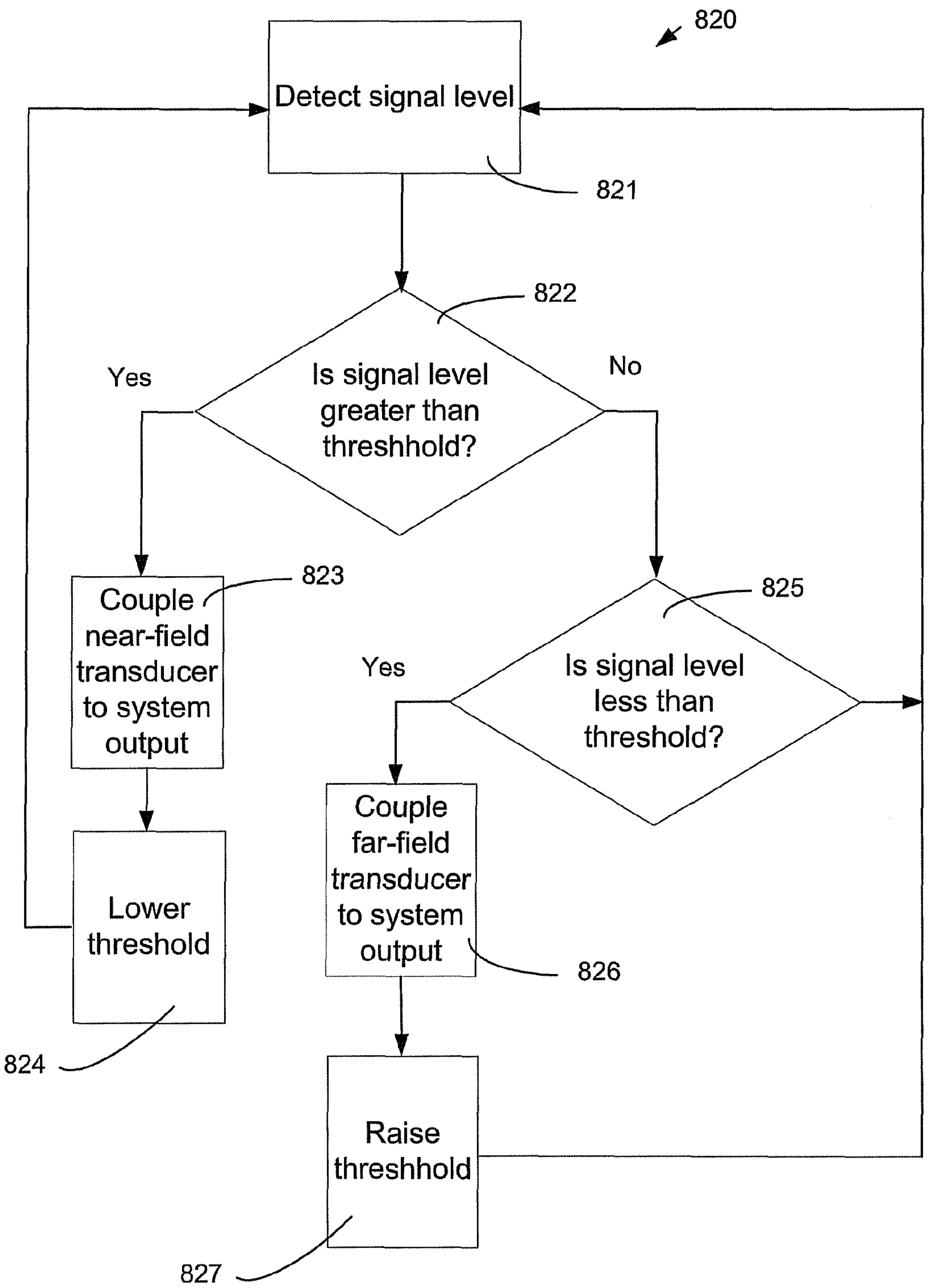
FIG. 8B shows a method of switching from one transducer to another as sound pressure level changes in accordance with an illustrative embodiment.

An alternate embodiment 821 is illustrated in FIG. 8B, in which different thresholds are set and used, depending on which transducer is coupled to the output. For example, if the incident audio signal has an amplitude that can be processed by the far-field transducer, then the threshold may be set relatively high (e.g., a first threshold). As such, if the sound pressure level increases beyond the threshold (822), the system will respond by switching (823) to the near-field transducer (in other words, the system will couple the near-field transducer to the system output). When the near-field transducer is coupled to the system output, it may be desirable to lower the threshold (824) so that the system does not switch back to the far-field transducer if the incident audio signal dips slightly below the first threshold. Accordingly, the system optionally lowers the threshold (824) (e.g., to a second threshold), and then returns to monitoring the signal (821). As such, if the sound pressure level falls below the (lowered) threshold (825), the system will respond (826) by switching to (or back to) the far-field transducer (in other words, the system will couple the far-field transducer to the system output). At this time, the exemplary system resets, or raises, the threshold (827) to (or back to) a higher threshold (e.g., the first threshold), and then returns to monitoring the signal (821).

Figure 9:
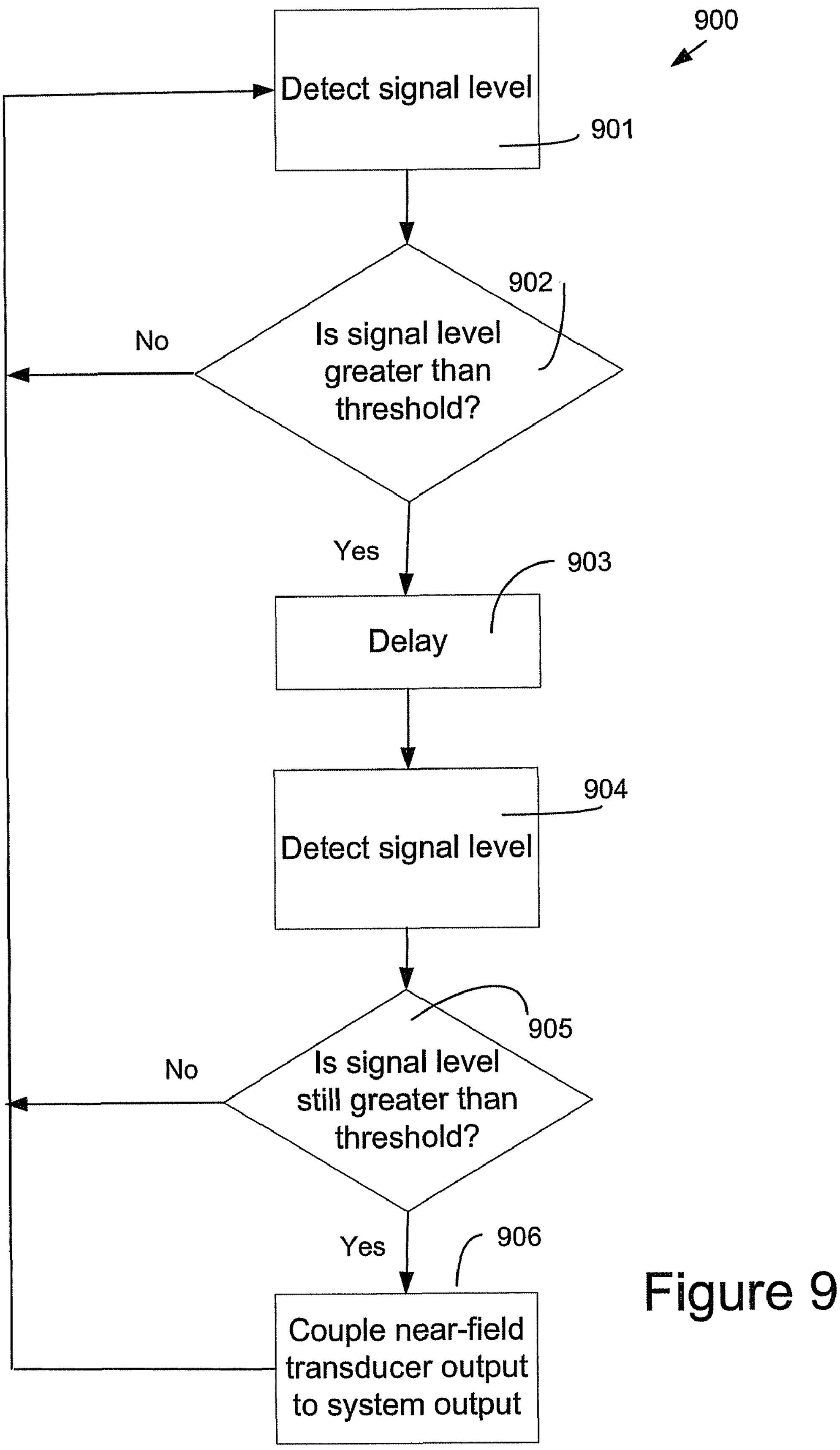
FIG. 9 shows an alternate method of switching from a far-field transducer to a near-field transducer as sound pressure level increases in accordance with an illustrative embodiment.

An alternate method 900 of switching from a far-field transducer to a near-field transducer as sound pressure level increases is shown in FIG. 9. The process begins at step 901, which detects an output signal from a transducer, and continues at step 902 in which the process compares the output signal to a threshold to determine whether the transducer output has crossed, exceeds, the threshold. If so, then the measurement is done once more at step 904 after a delay step 903, and compared to a threshold at step 905. If the sound pressure level still exceeds the threshold, then the output of the near-field transducer is coupled to the system output at step 906. If either measurement indicates that the sound pressure level is below the threshold, then the output of the far-field transducer remains coupled to the system output and the cycle begins again. The threshold value and the length of the delay are parameters determined by the system designer according to the needs of the system being designed.

In one embodiment, a delay may be combined with a cross-fade as discussed previously, so that the process of coupling the output of a near-field transducer to the system output can be implemented with a cross-fade. This may avoid, or mitigate, the coupling of a distorted output (from a far-field transducer) to the system output. For example, a digital cross-fade with a delay could be implemented in the digital domain to prevent a distorted signal from reaching the system output, even in a transient situation.

Figure 10:
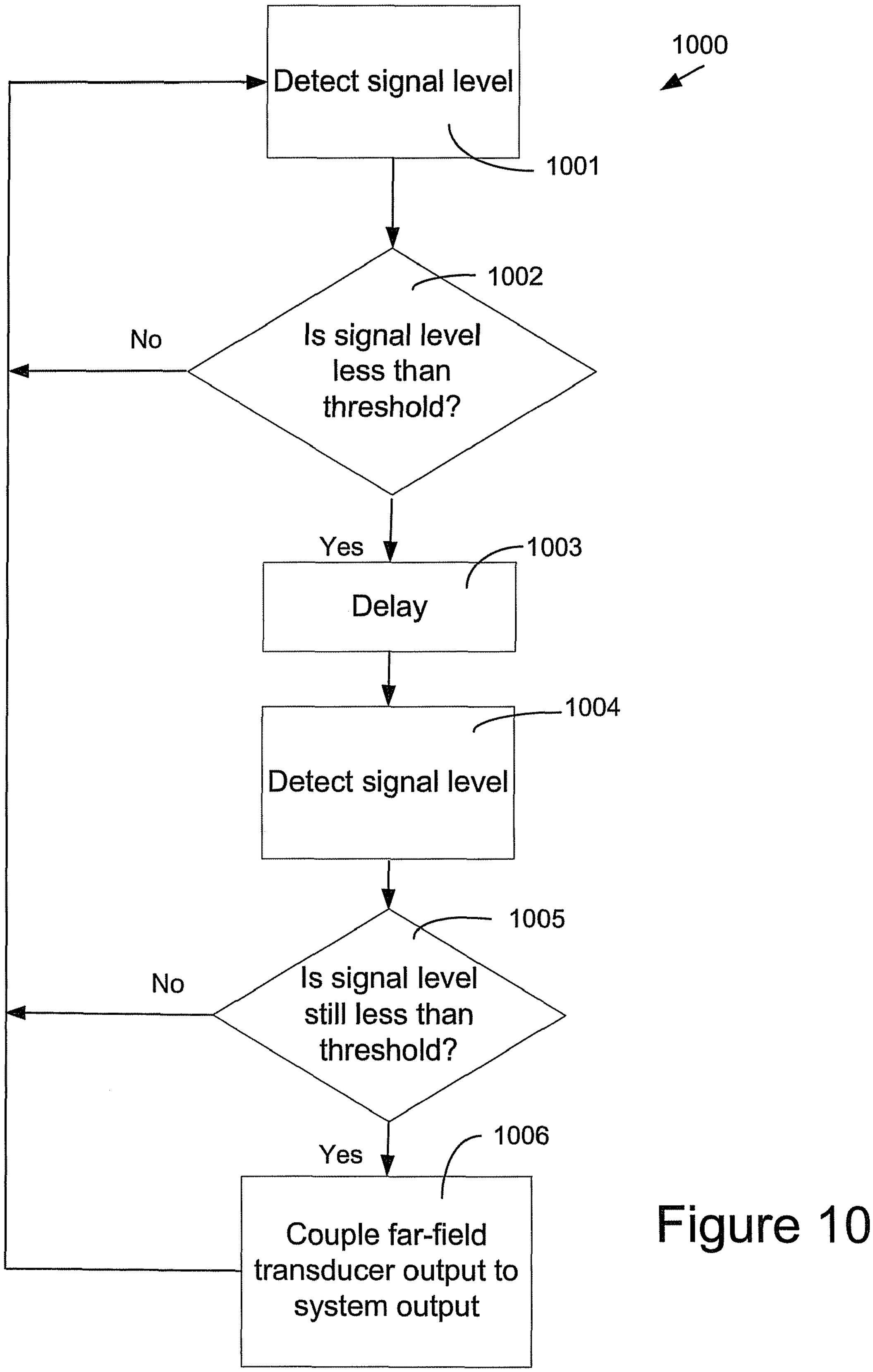
FIG. 10 shows an alternate method of switching from a near-field transducer to a far-field transducer as sound pressure level decreases in accordance with an illustrative embodiment.

A method 1000 of switching from a near-field transducer to a far-field transducer as sound pressure level decreases is shown in FIG. 10. The level of the incident sound pressure is detected at step 1001 and compared to a threshold at step 1002 to determine whether the sound pressure level has decreased to a point below the threshold. If so, then the measurement is done once more at step 1004 after a delay step 1003, and compared to a threshold at step 1005. If the sound pressure level is still below the threshold, then the output of the far-field transducer is coupled to the system output at step 1006. If either measurement indicates that the sound pressure level is above the threshold, then the output of the near-field transducer remains coupled to the system output and the cycle begins again. The threshold value and the length of the delay are parameters determined by the system designer according to the needs of the system being designed.

The threshold values used may be different at different points in the process, and may depend on which transducer is coupled to the system output at the time the comparison is made. For example, if the sound pressure level is low and the far-field transducer is supplying the system output, then a relatively high threshold value may be set so that the transition to a near-field transducer does not happen at a level that is still comfortably within the dynamic range of the far-field transducer. Alternately, if the sound pressure level is high and the near-field transducer is supplying the system output, then a relatively low threshold value may be set so that the transition to the far-field transducer does not happen at a level that is still comfortably within the dynamic range of the near-field transducer. In general, however, the threshold values can be set at any of one or more points where the dynamic ranges of the transducers overlap.

It should be noted that the specific threshold values and ranges recited above are exemplary for illustrative embodiments of the invention. Those skilled in the art should understand that other threshold values and ranges can be used to accomplish similar goals for different devices. Those skilled in the art should also recognize that any number of transducers could be used to implement systems consistent with this invention.

In an alternative embodiment, the disclosed apparatus and methods (e.g., see the flow charts described above) may be implemented as a computer program product for use with a computer system. Such implementation may include a series of computer instructions fixed either on a tangible medium, such as a computer readable medium (e.g., a diskette, CD-ROM, ROM, or fixed disk) or transmittable to a computer system, via a modem or other interface device, such as a communications adapter connected to a network over a medium. The medium may be either a tangible medium (e.g., optical or analog communications lines) or a medium implemented with wireless techniques (e.g., WIFI, microwave, infrared or other transmission techniques). The series of computer instructions can embody all or part of the functionality previously described herein with respect to the system.

Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies.

Among other ways, such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of the invention may be implemented as a combination of both software (e.g., a computer program product) and hardware. Still other embodiments of the invention are implemented as entirely hardware, or entirely software.

Although the above discussion discloses various exemplary embodiments of the invention, it should be apparent that those skilled in the art can make various modifications that will achieve some of the advantages of the invention without departing from the true scope of the invention.

What is claimed is:

1. A microphone system for processing an audio signal, the microphone system comprising:

a first microphone for producing a first signal and having a first dynamic range, wherein the first dynamic range has a first noise floor and a first top-end;

a second microphone for producing a second signal and having a second dynamic range, wherein the second dynamic range has a second noise floor and a second top-end, and wherein the first noise floor is less than the second noise floor, the second top-end is greater than the first top end, and wherein the first dynamic range overlaps the second dynamic range;

a system output; and a selector operably coupled to the first microphone and the second microphone, the selector configured to selectively couple the first signal to the system output when the amplitude of the audio signal crosses below a first threshold, and to couple the second signal to the system output when the amplitude of the audio signal crosses above a second threshold such that the dynamic range of the microphone system is greater than the dynamic range of the first microphone and is also greater than the dynamic range of the second microphone.

2. The microphone system of claim 1 wherein the first threshold and the second threshold are both within the overlap of the first dynamic range and the second dynamic range.

3. The microphone system of claim 1, wherein first microphone has a first noise floor, and the second microphone has a second noise floor that is higher than the first noise floor, and the dynamic range of the microphone system is determined, at least in part, by first noise floor.

4. The microphone system of claim 1, wherein the dynamic range of the first microphone has a first top-end, and the dynamic range of the second microphone has a second top-end that is higher than the first top-end, and the dynamic range of the microphone system is determined, at least in part, by the second top-end.

5. The microphone system of claim 1, wherein the first threshold is 90 dBSPL and the second threshold is 100 dBSPL.

6. A microphone system according to claim 1 wherein the selector comprises a switch.

7. A microphone system according to claim 1 wherein at least one microphone comprises a MEMS structure.

8. A microphone system according to claim 7 wherein the first and second microphones reside on a common substrate.

9. A microphone system according to claim 8, wherein the first microphone comprises a MEMS structure and the second microphone comprises a MEMS structure.

10. A microphone system according to claim 1 wherein the top of the dynamic range of the second microphone is higher than the top of the dynamic range of the first microphone, wherein the top of a dynamic range is the point at which total harmonic distortion of the microphone's output signal reaches ten percent.

11. A microphone system according to claim 1 further comprising at least one amplifier operably connected between one of the microphones and the system output.

12. A microphone system according to claim 11 further comprising a second amplifier operably connected between the other one of the microphones and the system output.

13. A method of operating a microphone system, the microphone system having a system output, and a selector having a first mode and a second mode, the method comprising:

providing a first transducer having a first transducer output and a first dynamic range, wherein the first dynamic range has a first noise floor and a first top-end;

providing a second transducer having a second transducer output and a second dynamic range, wherein the second dynamic range has a second noise floor and a second top-end, and wherein the first noise floor is equal to or less than the second noise floor, the second top-end is greater than the first top end, and wherein the first dynamic range overlaps the second dynamic range;

detecting whether the amplitude of an incident audio signal crosses above a threshold, wherein the threshold comprises a first threshold value; and setting the mode of the selector to the second mode if the amplitude of the incident audio signal crosses above the threshold, wherein the second mode couples the second transducer output to the system output.

14. A method according to claim 13, further comprising setting the threshold to a second threshold value if the amplitude of the incident audio signal crosses above the threshold.

15. A method according to claim 13, further comprising:

detecting whether the amplitude of the incident audio signal crosses below the threshold, wherein the threshold comprises a second threshold value; and setting the mode of the selector to the first mode if the amplitude of the incident audio signal crosses below the threshold, wherein the first mode couples the first transducer output to the system output.

16. A method according to claim 15, further comprising setting the threshold to the first threshold value if the amplitude of the incident audio signal crosses below the threshold.

17. A method according to claim 13 further comprising maintaining the selector in the second mode until the amplitude of the incident audio signal falls below a second threshold value.

18. A method according to claim 15, further comprising maintaining the selector in the first mode until the amplitude of the incident audio signal exceeds the first threshold value.

19. A method according to claim 14, wherein the first threshold value exceeds the second threshold value.

20. A method according to claim 13 wherein detecting whether the amplitude of an incident audio signal crosses above a threshold further comprises detecting whether the amplitude of the incident audio signal exceeds the threshold for a predetermined amount of time.

* * * * *